(12) United States Patent
Puvanendralingam et al.

(10) Patent No.: US 10,892,160 B2
(45) Date of Patent: Jan. 12, 2021

(54) METHOD FOR PRODUCING ELECTROTECHNICAL THIN LAYERS AT ROOM TEMPERATURE, AND ELECTROTECHNICAL THIN LAYER

(71) Applicant: DYNAMIC SOLAR SYSTEMS AG, Frankfurt (DE)

(72) Inventors: Gangadaran Puvanendralingam, Bad Ems (DE); Patrick Linder, Lehrberg (DE); Daniel Linder, Lehrberg (DE)

(73) Assignee: DYNAMIC SOLAR SYSTEMS AG, Frankfurt (DE)

( * ) Notice: Subject to any disclaimer, the term of this patent is extended or adjusted under 35 U.S.C. 154(b) by 0 days.

(21) Appl. No.: 15/554,074

(22) PCT Filed: Feb. 26, 2016

(86) PCT No.: PCT/DE2016/100086
§ 371 (c)(1),
(2) Date: Aug. 28, 2017

(87) PCT Pub. No.: WO2016/134706
PCT Pub. Date: Sep. 1, 2016

(65) Prior Publication Data
US 2018/0040429 A1    Feb. 8, 2018

(30) Foreign Application Priority Data
Feb. 26, 2015   (DE) .................. 10 2015 102 801

(51) Int. Cl.
*H01G 9/042*      (2006.01)
*H01L 21/02*      (2006.01)
(Continued)

(52) U.S. Cl.
CPC ..... *H01L 21/02628* (2013.01); *H01G 9/0036* (2013.01); *H01G 9/028* (2013.01);
(Continued)

(58) Field of Classification Search
CPC . H01G 9/0036; Y10T 428/24802; B32B 3/10; H01L 21/02521; H01L 21/02601; H01L 21/02628
See application file for complete search history.

(56) References Cited

U.S. PATENT DOCUMENTS 3,930,257 A   12/1975  Quang et al.
4,040,925 A    8/1977  McGinniss
(Continued)

FOREIGN PATENT DOCUMENTS

AT         36002      8/1988
CA       2467690      6/2003
(Continued)

OTHER PUBLICATIONS

International Search Report for PCT/DE2016/100086, English Translation attached to original, Both completed by the European Patent Office dated Jul. 27, 2016, All together 5 Pages.

*Primary Examiner* — Gerard Higgins
(74) *Attorney, Agent, or Firm* — Mark M. Friedman

(57) ABSTRACT

The present method for the first time proposes a method for producing an electrotechnical thin layer which makes it possible to carry out process control at room temperature by using an additional reagent, thereby providing stable, thin layers in a very short time. Capacitive accumulators that could replace a Li-ion battery in a tablet PC and more far-reaching applications are thus possible even for cases of gross, industrial process control.

2 Claims, 2 Drawing Sheets

(51) Int. Cl.
    *H01G 9/00*     (2006.01)
    *H01G 9/028*    (2006.01)
    *H01G 9/15*     (2006.01)

(52) U.S. Cl.
    CPC .............. *H01G 9/042* (2013.01); *H01G 9/15* (2013.01); *H01L 21/02422* (2013.01); *H01L 21/02521* (2013.01); *H01L 21/02601* (2013.01); *Y10T 428/24802* (2015.01)

(56) References Cited

U.S. PATENT DOCUMENTS

| | | | |
|---|---|---|---|
| 4,911,992 | A | 3/1990 | Haluska et al. |
| 4,915,984 | A | 4/1990 | Murakami |
| 5,272,017 | A | 12/1993 | Sundararajan et al. |
| 6,146,818 | A | 11/2000 | Gonzalez et al. |
| 6,416,818 | B1 * | 7/2002 | Aikens ............... B82Y 30/00 427/383.1 |
| 6,863,923 | B1 | 3/2005 | Kalleder et al. |
| 8,043,909 | B2 | 10/2011 | Ebbers et al. |
| 8,101,097 | B2 | 1/2012 | Bahnmuller et al. |
| 2004/0131934 | A1 | 7/2004 | Sugnaux et al. |
| 2006/0199313 | A1 | 9/2006 | Harting et al. |
| 2008/0182011 | A1 | 7/2008 | Ng et al. |
| 2009/0026458 | A1 | 1/2009 | Ebbers et al. |
| 2010/0040846 | A1 | 2/2010 | Bahnmüller et al. |
| 2010/0122726 | A1 | 5/2010 | Lee |
| 2010/0301375 | A1 | 12/2010 | Chen et al. |
| 2011/0081575 | A1 | 4/2011 | Voelker et al. |
| 2011/0248370 | A1 | 10/2011 | Tsoi et al. |
| 2013/0143071 | A1 | 6/2013 | Kleinle |
| 2014/0161972 | A1 * | 6/2014 | Dong ............... C23C 18/1607 427/125 |
| 2015/0155403 | A1 | 6/2015 | Torardi et al. |

FOREIGN PATENT DOCUMENTS

| | | |
|---|---|---|
| CN | 103214340 | 7/2013 |
| CN | 103293600 | 9/2013 |
| CN | 103839605 | 6/2014 |
| DE | 390400 | 2/1924 |
| DE | 410375 | 3/1925 |
| DE | 839396 | 5/1952 |
| DE | 1446978 | 2/1969 |
| DE | 2004076 | 8/1971 |
| DE | 3106654 | 12/1981 |
| DE | 266693 | 4/1989 |
| DE | 3784645 | 9/1993 |
| DE | 3650278 | 9/1995 |
| DE | 19647935 | 5/1998 |
| DE | 19815291 | 10/1999 |
| DE | 19946712 | 4/2001 |
| DE | 102007014608 | 9/2008 |
| DE | 102012107100 | 2/2014 |
| EP | 2119747 | 11/2009 |
| JP | H04249379 | 9/1992 |
| TW | 201442271 | 11/2014 |
| WO | 2007017192 | 2/2007 |
| WO | 2011021982 | 2/2011 |
| WO | 2012000001 | 1/2012 |
| WO | 2014019560 | 2/2014 |

* cited by examiner

METHOD FOR PRODUCING ELECTROTECHNICAL THIN LAYERS AT ROOM TEMPERATURE, AND ELECTROTECHNICAL THIN LAYER

CROSS-REFERENCE TO RELATED APPLICATION

This application is the U.S. national phase of PCT Application No. PCT/DE2016/100086 filed on Feb. 26, 2016, which claims priority to DE Patent Application No. 10 2015 102 801.8 filed on Feb. 26, 2015, the disclosures of which are incorporated in their entirety by reference herein.

TECHNICAL FIELD

The present invention can generally be assigned to the field of electrotechnical thin layers. The applicant was already working in this field, as illustrated by the applications DE 2012 107 100 A1 and WO 2014 019 560 A1. The general technical background and the known measures and methods are reasonably reflected in the prior art researched in these applications. For example, DE 2 004 076 A1 or else DE 31 06 654 A1 discloses, for small devices, combinations of PV modules with thermogenerators, capacitors or accumulators. Screen-printed CdS/CdTe solar cells have been known since 1980—for example from the Japanese Journal of Applied Physics, Volume 19, Number 4, 'Screen printed thin film CdS/CdTe solar cell'.

By contrast with the prior art, the applicant's applications disclosed a method in which it was possible to obtain an astonishingly flexible printed hybrid PV layer composite by means of freshly crushed and/or deagglomerated inorganic particulate salt-free pastes by thermal compaction with proportions of nanoscale particles and volatile organic solvents. The highly flexible composite allows unusual applications, but has not become established industrially as a base product with broad applicability. In view of organic PV inks which can be applied like a paint with a brush and can be dried with outgassing of volatile organic solvents—referred to hereinafter as 'VOCs'—in order to achieve PV layer sequences, industrial demands on broadly usable PV layers and electrotechnical thin films were as follows:

An electrotechnical layer/layer sequence was required that
  can be produced industrially at room temperature
  has a minimized level of VOCs
  does not include any aromatic/toxic organic materials.

Under these boundary conditions, there is therefore a need in the industrial sector for a novel method. With the present invention, the applicant claims an appropriate novel method for electrotechnical thin layers.

DESCRIPTION OF THE PRIOR ART

The present invention relates to methods of producing electrotechnical thin layers and to electrotechnical thin layers according to the preamble of the independent claims.

Thin layers of the generic type are known, for example, from DE 37 84 645 T2: a preceramic polymer is provided dispersed in organic solution, applied and cured by drying. However, a disadvantage of these layers is that the cured layer then has to be baked at 200 degrees Celsius to 400 degrees Celsius for about one day, in order to obtain a ceramic layer having semiconductive and/or conductive properties. It is found here, however, that ceramic layers of this kind are also usable as dielectric layers and doped dielectric layers. However, this document, for additional electrode layers or outer layers, envisages PVD or CVD methods which disadvantageously require vacuum chambers and incur high apparatus costs.

WO 2011 021 982 A1 discloses a method of producing an electrode layer in which carbon nanotubes are contacted with metal clusters in solution and are then deposited on a membrane filter and dried. The deposited conglomerate of carbon nanotubes can then be removed as a thin layer. Disadvantageously, this document then envisages combination with acidic polymer electrolytes, which then gives a layer composite with partly liquid electrolyte. The charge-discharge curves of the corresponding catalyst show a distinct decrease in the amount of energy storable with each cycle, which suggests electrochemical storage processes with side reactions. Reversibility of the electrochemical storage processes no longer exists to an extent of more than 90%, which means that the amount of energy storable already declines considerably after a few charging cycles.

It was therefore an object of the present invention to overcome the disadvantages of the prior art and to provide a method and an electrotechnical thin layer according to the method, which, in spite of industrial processing and large-area fabrication, can offer thin layers that are durable, stable and virtually 100% reversible in terms of their electrotechnical properties.

This object is achieved according to the features of the independent claims. Advantageous embodiments will be apparent from the dependent claims and the description which follows.

SUMMARY OF THE INVENTION

The invention provides a room temperature method of producing electrotechnical thin layers, by providing electrically conductive and/or semiconductive, inorganic agglomerates in a dispersion over an area and curing them to form a layer, characterized in that
  the curing is conducted at room temperature and
  the curing is accelerated by contacting with at least one reagent.

An electrotechnical thin layer according to the method is characterized in that
  the thin layer has a thickness of 5 to 50 micrometers,
  the thin layer has a resistance of 30±15 ohms per square centimeter,
  the thin layer has an inorganic content of at least 80 percent by weight, the remainder consisting of inorganic modifiers and auxiliaries and nonaromatic polymeric additions.

DESCRIPTION OF THE INVENTION AND ADVANTAGEOUS FEATURES

In the context of the present invention, a 'room temperature method' refers to a process regime at standard ambient temperature. In Europe, such a temperature is around 20 degrees Celsius. According to the environment and weather situation, temperatures of 10 degrees Celsius to 50 or 60 degrees Celsius are also possible in factory halls. What is crucial here is merely that the method can be conducted under such conditions without special monitoring of room temperature.

In the context of the present invention, 'electrotechnical thin layers' refer to layers having a thickness within the micrometer range, i.e. from 0.1 micrometer to several hundred micrometers. Standard layer thicknesses in the case of electrotechnical thin layers are frequently in the range from 5 to 50 micrometers, since dimensions of this kind can be established reliably even in the case of process regimes regulated at relatively long intervals.

Electrotechnical thin layers are electrically conductive and/or semiconductive layers of the above-described thickness and can be used in a layer composite as contact or as functional layer. Purely ceramic thin layers, by contrast, would be usable solely as insulator. With regard to possible uses of semiconductive and/or conductive layers, reference is made to the industrial sector and the documents and examples cited therein.

In the present context, the aim is a method in which electrically conductive and/or semiconductive inorganic agglomerates in a dispersion are provided over an area and cured to form a layer. In the context of the present invention, 'inorganic agglomerates' are particles which, in their inorganic composition, comprise carbon at least in elemental form or in an inorganic compound comprising carbide, graphite, carbon black or oxide. The size of the agglomerates affects the thickness of the layer: if precipitates of a metal oxide of 0.5 micrometer in size are used to form a sequence of 2 to 3 layers, a layer of thickness 1.5 micrometers will be obtained with a uniformity of ±0.5 micrometer. However, the prior art disadvantageously always envisages subsequent baking or sintering at elevated temperature for inorganic agglomerates, or the result is merely loose composites that cannot be used as a stable, durable layer. Stable layer combinations in particular cannot be obtained with the latter layers.

The invention for the first time claims a method in which
the curing is conducted at room temperature and
the curing is accelerated by contacting with at least one reagent. The contacting with a reagent can considerably shorten curing times and achieve short processing steps that are necessary in industry. In this context, the reagent actively intervenes in the curing process, in which solvents are bound and/or the crosslinking reaction is accelerated at the points of contact of the agglomerates with one another/with the subsequent substrate layer.

The method is preferably characterized in that the dispersion is provided in the form of an aqueous moist dispersion to aqueous wet dispersion. Water is always available as a dispersant and solvent and is industrially available directly. Compared to established organic solvents, it offers the advantage that it does not necessitate any precautions at all from a toxicological point of view.

The method is preferably characterized in that the reagent used is an acid halide. In the specific, particularly preferred case, a slightly moist, basic dispersion of a metal phase was deposited on a carrier in a thin layer. In order to accelerate the drying, under air suction, the layer was purged with thionyl chloride, empirical formula $SOCl_2$, also referred to as sulfurous acid dichloride. This gave rise to sulfur dioxide gas and HCl gas under reaction with water. In addition, the hydrochloric acid gas released reacted with available hydroxides to give corresponding chlorides. The overall layer solidified instantaneously to form a white crust that could subsequently be rinsed off with distilled water. The layer thus obtained was homogeneous, continuous and stably crosslinked: the metallically flexible steel substrate could be bent and also significantly agitated without resulting in exfoliation. The inventors assume that the additional removal of moisture in combination with formation of correspondingly hygroscopic salts crosslinks the agglomerates at their sites of contact via oxygen bonds and with removal of water in an extremely accelerated manner. Against this background, a 'reagent' in the context of the present invention can be any compound which, in a combined manner, can remove solvents and simultaneously assist crosslinking at the sites of contact of the agglomerates.

The method is preferably characterized in that the reagent used is at least one redox-active reagent selected from the group consisting of halogen, halogen-chalcogen compound, fluorine, chlorine, bromine, iodine, hypohalite, halite, halogenate, perhalogenate, light photons from the UV range, oxygen, oxygen enriched with ozone, ozone, perborate, percarbonate, peroxodisulfate.

The method is preferably characterized in that the reagent used is at least one acid- or base-active reagent selected from the group consisting of halogen-hydrogen, hypohalite acid, halite acid, halogen acid, perhalogen acid, hypochlorous acid, chlorous acid, chloric acid, perchloric acid, dry $CO_2$, dry $NH_3$, thionyl chloride, sulfuryl chloride, phosphorus oxydichloride, phosphorus trichloride.

The method is preferably characterized in that the curing is assisted by at least one polymerizable addition, the polymerizable addition being selected from the group consisting of swellable polysaccharide, agar-agar, carrageenan, tragacanth, gum arabic, alginates, pectin, swellable polypeptide, gelatin, carboxymethyl cellulose, hydroxyethyl cellulose, polyacryloyls, polycarboxylic acids, polyethers, polyamides, polyimides, organosilicon compound having a polymerizable methacrylate-based side group, organosiloxane, silicone polyether.

The method is preferably characterized in that the electrotechnical thin layer is modified at the edge in the incompletely cured state with at least one of the aforementioned reagents. The treatment of a layer having metallic components with sulfuryl chloride resulted in catalytic formation of chlorine traces. These oxidized an incompletely cured layer at the edge and imparted semiconductor properties to this layer.

The inventors assume that controlled use of suitable oxidizing reagents, reducing reagents and/or reagents that form solid substances can adjust the valency and/or the structural defects of edge layers, such that the layers can correspondingly be adjusted in a versatile manner to the disclosure of DE 37 84 645 T2 and can be configured as effective semiconductor combinations, for example as PV layer sequences and/or regulating transistors. The high-voltage behavior of the present working example indicates that such layer modifications are possible and obtainable with the method claimed in the present context. Against this background, the present invention also discloses PV layer sequences and electrotechnical control circuits that can be obtained by building on the method claimed.

An electrotechnical thin layer of the invention—obtained by the method disclosed—is characterized in that
the thin layer has a thickness of 0.1 up to several hundred micrometers,
the thin layer has a resistance of not more than 30±15 ohms per square centimeter,
the thin layer has an inorganic content of at least 80 percent by weight, the remainder consisting of inorganic modifiers and auxiliaries and nonaromatic polymeric additions.

Preferably, the electrotechnical thin layer is characterized in that the thin layer is combined with further thin layers in accordance with the method, preferably arranged as a dielectric deposited between two two-dimensional electrodes.

Further advantages will be apparent from the working examples. It is self-evident that the features and advantages described above and the working examples which follow should not be interpreted in a restrictive manner. Advantageous additional features and additional combinations of features and uses as elucidated in the description and in the technical field and in common use can be implemented within the scope of the independent claims in the subject-matter claimed either individually or differently in combination, without leaving the scope of the invention.

BRIEF DESCRIPTION OF THE FIGURES

The figures illustrate, with reference to diagrams.

MORE DETAILED ELUCIDATION OF THE INVENTION WITH REFERENCE TO WORKING EXAMPLES

Figure 1:
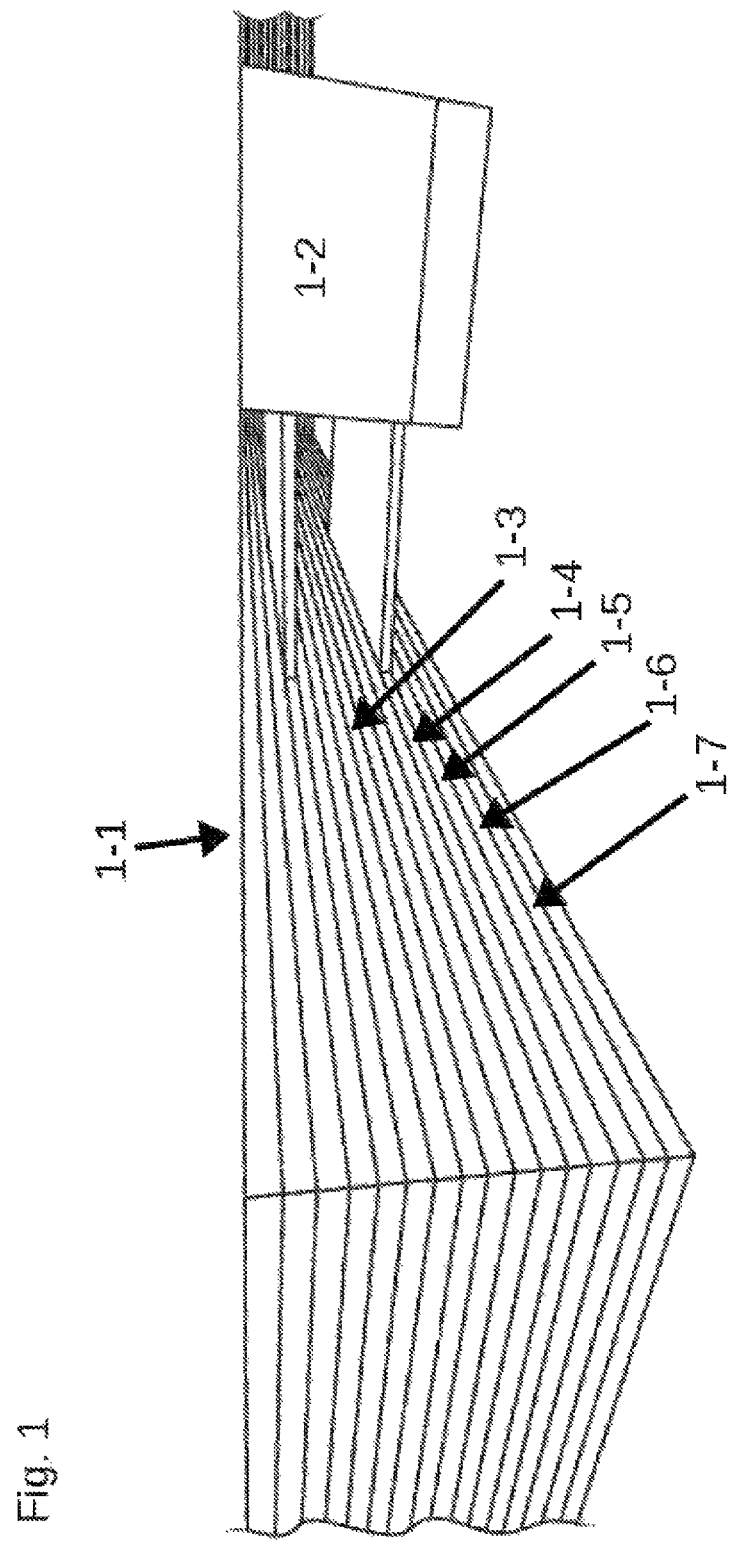
FIG. 1: advantageous embodiment of a multilayer sequence that can serve as a capacitative power storage means.

In an advantageous embodiment, an electrotechnical thin layer is arranged in a sequence of a multitude of electrode layers, dielectric layers and electrode substrate layers, wherein at least the dielectric layers and/or the electrode substrate layers have been deposited in accordance with the method, wherein
  anode substrate layers consist of cured sodium-silicon waterglass layers with graphite particles,
  cathode substrate layers consist of cured sodium-silicon waterglass layers with titanium oxide particles,
  dielectric layers consist of cured layers of gelling agent with a polyiodide component and/or iodine component,
  the sequence of layers is usable in a reversible manner as a capacitative, physicochemical power storage means with charging voltages up to 12 volts,
  the sequence of layers has an energy density of at least 100 and preferably 200 to 600 Wh per kilogram,
  each layer has a resistance of not more than 25±5 ohms per square cm,
  the electrode layers have contacts arranged so as to protrude from the sides of the layer sequence,
  the contacts are connected to an up/down converter,
  the up/down converter has a control circuit for keeping an output voltage constant and
  the up/down converter has a connection for an external load with constantly controlled output voltage.

As a further advantageous embodiment, it was possible by the method disclosed in the present context to produce a substitute for a lithium/polymer accumulator—preferably usable in a tablet PC—: on a film carrier of 3×3 centimeters, for this purpose, first a suitable, metallically conductive electrode—preferably in the form of an aqueous dispersion of "conductive silver" or "conductive aluminum paste"—is applied and cured. Thereafter, a layer of an aqueous $Si/SiO_2/Na_2O$ (soda-silicon-waterglass) with additional graphite particles is applied as conductive agglomerates. An acidic, drying reagent accelerates the curing, and a cured anode substrate is obtained with a reaction time of less than one minute. Preferably, the layer is kept very thin (0.1 micrometer to 15 micrometers) in order not to exceed the internal resistance of about 30 ohms per $cm^2$; for this purpose, graphite particles of not more than 0.5 micrometer are dispersed with partial basic dissolution in combination with silicon agglomerates of not more than 1 to 2 micrometers, applied homogeneously in two- to three-layer packing by dipping, spraying, flow-coating, spinning or printing, and cured instantaneously by contacting with acidic and/or oxidative reagent as a continuous layer. As an active dielectric, a fresh dispersion of gelling agent—preferably E406—water and potassium polyiodide solution—preferably iodine-potassium iodide or povidone iodine—is then applied over the area, prepared with formation of water-binding agglomerates (0.1 μm to 15 μm are obtainable with reaction times of 30 seconds to several minutes), and finally cured. Thereafter, a cathode substrate composed of a mixture of $Si/SiO_2/Na_2O$ (soda-silicon-waterglass) and $TiO_2$ is applied as an aqueous dispersion in the manner described above and cured. Finally, a further electrode is applied as described above. By multiple repetition of the steps described above, it is possible to obtain a 'stack', a sequence of dielectric layers, wherein the individual electrodes can be contacted via broad contact strips run along the outside. Multiplication of capacity is simple to achieve in thus sandwich structure, and the short production times allow multiple repetitions within a few minutes. More preferably, the electrode layers are each coated repeatedly in the reverse sequence of the prior layers and can thus fulfill a double function, as a result of which it is possible to save electrode material.

Figure 2:
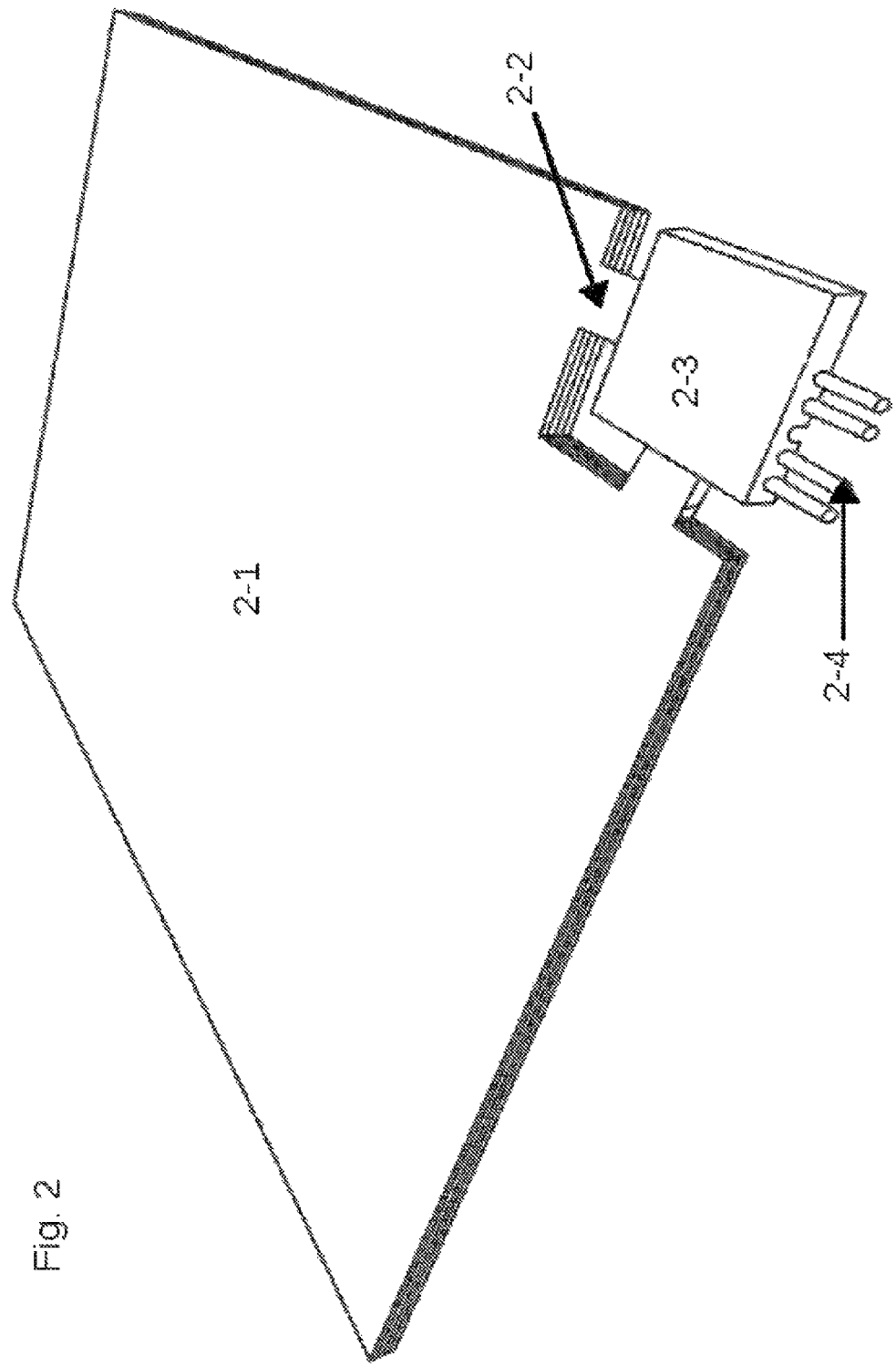
FIG. 2: advantageous embodiment as per FIG. 1 in isometric view.

FIG. 1 illustrates a design of a working example thus obtainable. According to FIG. 1, the high-performance capacitance storage means thus created is connected to an up/down converter. Depending on the necessary and available power, this connects various electrodes in the stack to a load. In the present case, for the first experiments, a supply voltage of 3.7 volts was to be provided. With the aid of the up/down converter, it was possible to achieve a constant output power until complete discharge (for design see FIG. 2). A prolonged stress test of the above-described individual dielectric layer with one million charge-discharge cycles with a constant current of 40 mA, a charge voltage of 12 volts and a discharge voltage of 10 volts until complete discharge did not show any measurable deterioration at all. Against this background, the inventors are assuming purely physicochemical power storage which does not alter the dielectric and must be reversible to an extent of more than 99.99%. In the case of layer thicknesses of preferably 0.1 to 15 micrometers, an energy density of 200 to 600 Wh per kg is calculated from the measured values. Energy densities of at least 100 Wh per kg are thus possible in a reliable manner and even with a rough process regime in a synthesis process. Overload tests showed high safety of the layer sequence thus produced: beyond 12 volts, the dielectric layer exhibited breakdown as would be typical of diodes: there was a short circuit. A massive increase in the ampere figure, by contrast, led to dissolution/detachment of the corresponding metal electrodes: the electrode layer blackened and broke up, which resulted in breakage of the electrical contact from the layer sequence. In no case could the layer sequence be made to explode, deflagrate or detonate.

INDUSTRIAL APPLICABILITY

With the present method, for the first time, a method of producing an electrotechnical thin layer is proposed, in which a process regime at room temperature, through use of an additional reagent, provides stable thin layers within a very short time. Capacitative storage means that could replace a lithium ion accumulator in a tablet PC and further-reaching applications become available thereby, even with a rough industrial process regime.

LIST OF REFERENCE NUMERALS 1-1 anode
1-2 electrode connections for converter 1-3 anode substrate
1-4 cathode
1-5 cathode substrate
1-6 dielectric
1-7 anode substrate
2-1 capacitor stack
2-2 contact strips of various electrodes
2-3 up/down converter
2-4 load connection

The invention claimed is:

1. A capacitive storage device having a combination of electrotechnical thin layers forming a sequence of a multitude of electrotechnical layers, the sequence comprising: electrode layers (a), comprising at least one anode layer (a1), at least one cathode layer (a2); at least one dielectric layer (b) and electrode substrate layers (c), comprising at least one anode substrate layers (c1) and at least one cathode substrate layer (c2), all these layers forming at least one sequence (a1)(c1)(b)(c2)(a2) of layers, wherein the one sequence of layers is obtained by a room temperature method, the method comprising providing electrically conductive and/or semiconductive, inorganic agglomerates in a dispersion over an area of a carrier and curing the dispersion to form an electrotechnical thin layer, characterized in that at least for each dielectric layer (b) and electrode substrate layer (c):
the curing is conducted at room temperature,
the room temperature being in the range of 10° C. to 60° C.,
the layer being a thin layer, having a thickness of 0.1 up to 200 micrometers,
the thin layer has an inorganic content of at least 80 percent by weight,
the remainder consisting of inorganic modifiers and auxiliaries and nonaromatic polymeric additions; and
wherein the dispersion is provided in the form of an aqueous moist dispersion to aqueous wet dispersion and
the curing is accelerated by contacting with at least one reagent,
wherein the first thin layer is combined with further thin layers in accordance with this method,
the combination of layers being arranged as a dielectric deposited between two two-dimensional electrodes layers (a).

2. The capacitive storage device of claim 1, wherein
the combination of electrotechnical thin layers comprises a plurality of electrode layers (a), dielectric layers (b) and electrode substrate layers (c) as a combination of a multitude of sequences, each sequence having:
one anode substrate layer (c1) comprising cured sodium-silicon waterglass layers with graphite particles,
one cathode substrate layer (c2) comprising cured sodium-silicon waterglass layers with titanium dioxide particles, and
one dielectric layer (b) comprising cured layers of gelling agent with a polyiodide component and/or iodine component,
the combination of sequences of layers forming in a reversible manner a physicochemical capacitive power storage device with charging voltages up to 12 volts,
the power storage device having an energy density of at least 100 Wh per kilogram,
the anode substrate layers (c1) having a resistance of not more than 30 ohms per square cm,
the electrode layers (a) have contacts arranged so as to protrude from a side of the combination of sequences,
the contacts are connected to an up/down converter,
the up/down converter has a control circuit for keeping an output voltage constant, and
the up/down converter has a connection for an external load with constantly controlled output voltage.

* * * * *